United States Patent [19]
Park

[11] Patent Number: 5,936,566
[45] Date of Patent: Aug. 10, 1999

[54] AUTO-REFERENCE PSEUDO-FLASH ANALOG TO DIGITAL CONVERTER

[75] Inventor: Sangbeom Park, San Diego, Calif.

[73] Assignee: Conexant Systems, Inc., Newport Beach, Calif.

[21] Appl. No.: 08/928,409

[22] Filed: Sep. 12, 1997

[51] Int. Cl.$^6$ .................................................. H03M 1/36
[52] U.S. Cl. ........................................ 341/159; 341/161
[58] Field of Search .................................. 341/155, 156, 341/158, 159, 161

[56] References Cited

U.S. PATENT DOCUMENTS

| | | | |
|---|---|---|---|
| 4,270,118 | 5/1981 | Brokaw | 341/159 |
| 4,306,224 | 12/1981 | Geller et al. | 341/161 |
| 4,611,196 | 9/1986 | Fernandez | 341/158 |
| 4,769,628 | 9/1988 | Hellerman | 341/162 |
| 4,987,417 | 1/1991 | Buckland | 341/159 |
| 5,014,057 | 5/1991 | Mintzer | 341/161 |

*Primary Examiner*—Marc S. Hoff
*Attorney, Agent, or Firm*—Snell & Wilmer; Philip K. Yu

[57] ABSTRACT

The n-bit A/D converter of the present invention includes a resistor network, n comparators, and ($2^n-1-n$) multiplexers. The resistor network generates a plurality of reference voltages characterized by uniform voltage increments between two fixed voltages. The n comparators are coupled to the resistor network. Each comparator receives a reference voltage and an analog input signal. Based on these inputs, an ith comparator generates an ith bit output in the n-bit digital signal where i ranges from 1 to n with the first bit being the most-significant-bit and the nth bit being the least-significant-bit. The ($2^n-1-n$) multiplexers are coupled between the resistor network and the ith comparator. In response to the output of comparators (except for the first comparator) associated with the more significant bits, the ($2^{i-1}-1$) multiplexers select a reference voltage and transmit it to the ith comparator. The ith comparator then compares the selected reference voltage with the analog input signal and generates the ith bit output.

30 Claims, 8 Drawing Sheets

(PRIOR ART)

AUTO-REFERENCE PSEUDO-FLASH ANALOG TO DIGITAL CONVERTER

FIELD OF THE INVENTION

The present invention relates to the field of analog to digital converters and more particularly to pseudo-flash analog-to-digital converters utilizing multiplexers and decoders.

BACKGROUND ART

In interfacing between the analog and digital world, the analog-to-digital (A/D) converter is a vitally important device. The A/D converter converts an analog signal such as a voltage or a current into a digital signal, which can be further processed, stored, and disseminated using digital computers. For example, A/D converters are used in communications, appliances, signal processing, computers, and any other fields that require conversion of analog signals into digital forms.

The A/D converter encodes an analog input signal into a digital output signal of a predetermined bit length, n. The encoding of the analog input voltage, $V_A$, into a digital output signal of n-bits is typically approximated as a binary fraction of a full-scale output voltage, $V_{FS}$. Hence, the output of the converter corresponds to an N-bit digital word D given as:

$$D = V_A / V_{FS} = (b_1/2^1) + (b_2/2^2) + \ldots + (b_n/2^n),$$

where $b_1, b_2, \ldots, b_n$ are the binary bit coefficients having a value of either a 1 or 0. The binary coefficient $b_1$ represents the most significant bit while $b_n$ represents the least significant bit. The binary bit coefficients are obtained from the output of the A/D converter.

Figure 1:
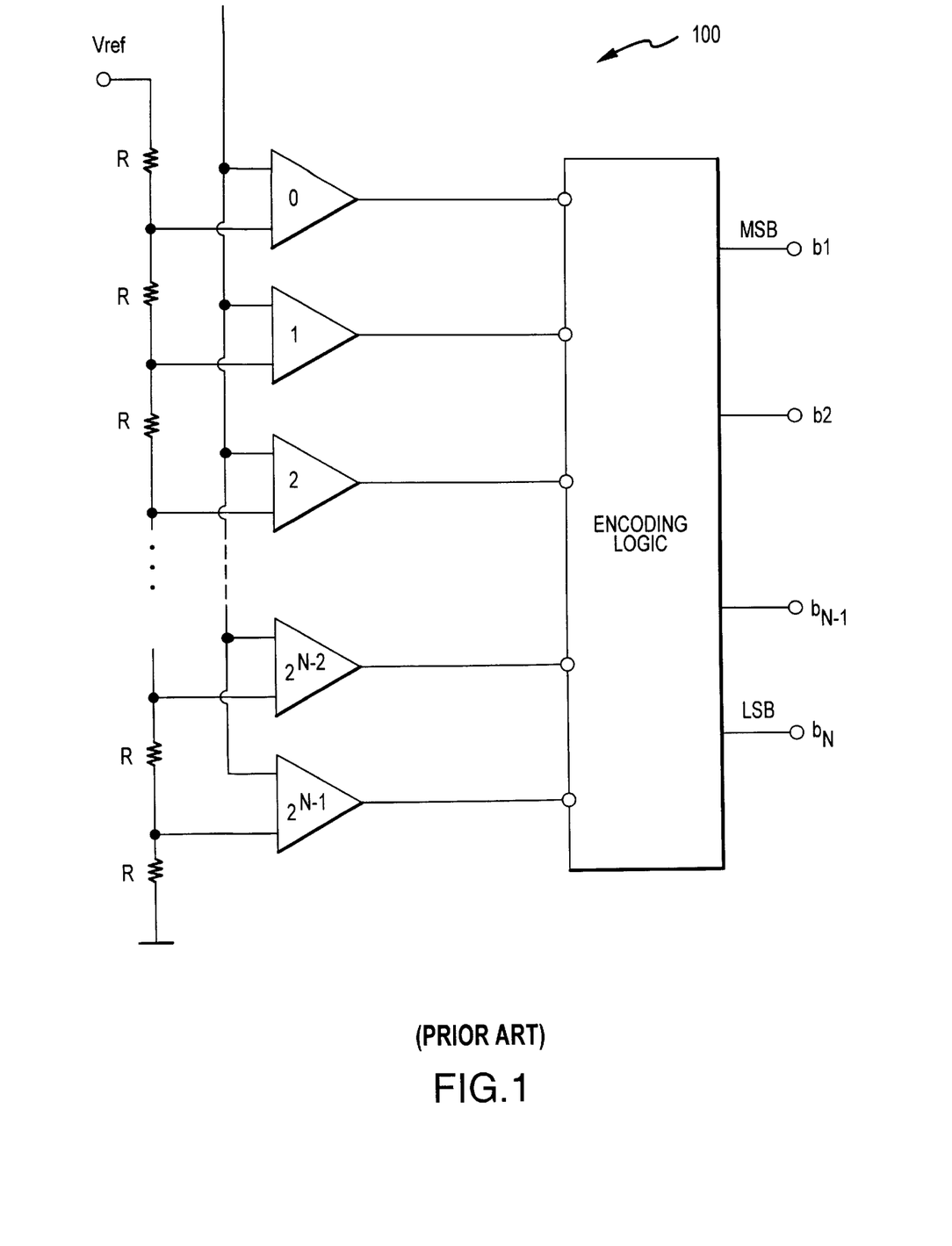
FIG. 1 illustrates a circuit diagram of a conventional flash A/D converter.

When an A/D converter generates digital data or the binary bit coefficients at its output simultaneously and in parallel, it is generally referred to as a flash or parallel A/D converter. Prior Art FIG. 1 illustrates a circuit diagram of a conventional n-bit flash A/D converter 100. The flash A/D converter 100 is comprised of a plurality of resistors, a plurality of comparators, and an encoding logic circuit. The resistors form a resistor network and are coupled in series between two potential voltages: a reference voltage, Vref, and a ground. In this resistor network, a set of reference voltages are generated at the nodes between the series coupled resistors. Each of these reference voltages are then fed into a comparator.

The flash A/D converter of Prior Art FIG. 1 also includes $(2^n-1)$ comparators. Each comparator receives two inputs: a reference voltage described above and an analog input signal, $V_A$. The comparator compares the two input signals and generates an output signal consisting of two signals: V1 and V2. Typically, these are digital signals represent a value of "1" and "0," and are equivalent to the binary bit coefficients described above. Taken together, the comparators generate $2^n-1$ digital signals, which are then encoded into an n-bit digital signal by an encoding logic circuit. In this manner, an analog signal is transformed into an n-bit digital signal, comprised of bits $b_1$ (i.e., the most significant bit) through $b_n$ (i.e., the least significant bit).

One of the main advantages of the conventional flash A/D converter is its speed. In particular, by using a separate comparator with a fixed reference for every quantization level in a digital word, from zero to full scale, the conventional flash A/D converter provides conversion of analog signals into digital format in a single step. Due to this reason, the flash A/D converter has been widely implemented in an integrated chip (IC).

Unfortunately, the conventional flash A/D converters are costly and inefficient to implement in an integrated chip (IC). First, the conventional n-bit full flash A/D converter requires $(2^n-1)$ comparators. For example, a 4-bit flash A/D converter would require 15 comparators and an 8-bit flash A/D converter would need 255 comparators. Hence, the circuit complexity increases very rapidly as the number of bits are increased. In addition, the large number of comparators needed to produce an n-bit digital code are very expensive to implement in an IC. Second, comparators are typically implemented in the industry using operational amplifiers (op amps), which are more generally more expensive and bulkier to implement than other devices in an IC. Third, the traditional flash A/D converters generally incorporate an encoder logic circuit to encode the analog signal into digital format. This encoder circuitry adds additional cost and size to implement in an IC.

Thus, what is needed is an A/D converter that can be efficiently implemented with attendant savings in cost, space, and power consumption. The present invention satisfies these needs by providing a pseudo-flash A/D converter utilizing multiplexers and/or decoders in place of majority of the comparators.

SUMMARY OF THE INVENTION

The present invention provides an n-bit pseudo-flash A/D converter. The n-bit A/D converter of the present invention includes a resistor network, n comparators, and $(2^n-1-n)$ multiplexers. The resistor network generates a plurality of reference voltages characterized by uniform voltage increments between two fixed voltages. The n comparators are coupled to the resistor network. Each comparator receives a reference voltage and an analog input signal. Based on these inputs, an ith comparator generates an ith bit output in the n-bit digital signal where i ranges from 1 to n with the first bit being the most-significant-bit and the nth bit being the least-significant-bit. The $(2^n-1-n)$ multiplexers are coupled between the resistor network and the ith comparator. In response to the output of comparators associated with the more significant bits, the $(2^{i-1}-1)$ multiplexers select a reference voltage and transmit it to the ith comparator. The ith comparator then compares the selected reference voltage with the analog input signal and generates the ith bit output. In another embodiment, decoders are used in place of the multiplexers to select and transmit an appropriate reference voltage.

BRIEF DESCRIPTION OF THE DRAWINGS

The accompanying drawings, which are incorporated in and form a part of this specification, illustrate embodiments of the invention and together with the description, serve to explain the of the invention.

Prior Art

DESCRIPTION OF THE PREFERRED EMBODIMENTS

In the following detailed description of the present invention, an auto-reference pseudo-flash A/D converter, numerous specific details are set forth in order to provide a thorough understanding of the present invention. However, it will be obvious to one skilled in the art that the present invention may be practiced without these specific details. In other instances, well known methods, procedures, components, and circuits have not been described in detail so as not to unnecessarily obscure aspects of the present invention.

The present invention provides an n-bit resolution auto-reference pseudo-flash A/D converter circuit. The n-bit A/D converter of the present invention is comprised of a resistor network, n comparators, and ($2^n-1-n$) mutiplexers. The resistor network generates $2^n-1$ evenly spaced reference voltages between two voltage potentials such as Vref and ground. For example, for a 2-bit A/D converter, the resistor network generates 3 reference voltages of 3Vref/4, Vref/2, and Vref/4. In another embodiment, the A/D converter includes a decoder replacing the multiplexers for each bit level except the first two most-significant bit levels.

The n-bit auto-reference pseudo-flash A/D converter circuits of the present invention uses only n comparators. A comparator is a circuit that compares two different input signals to produce a digital output signal that can be only one of two levels, V1 or V2. For example, in an A/D converter setting, the comparator typically receives an analog input voltage, Vin, and a reference voltage, Vref. If Vin is larger than the Vref, then the output voltage of the comparator, Vout, is V1. On the other hand, if Vin is less than Vref, then Vout is V2. Hence, the output voltage of a comparator is usually limited to two voltage levels, V1 and V2, which can respectively be thought of as a high voltage, Vhi, and a low voltage, Vlo, respectively, or vice versa. In this manner, the digital signals corresponding to 1 and 0 or "n" and "off" are generated at the output of the comparator. Comparators are well known circuits in the art and can be implemented using various well known devices such as op amps, transistors, etc.

The comparators of the present invention are preferably characterized by high-common input range because the reference voltage of most comparators is not fixed. That is, the comparators can accept as inputs a wide range of voltages from a supply voltage (e.g., Vdd, Vref, etc.) to ground voltage level. Preferably, the range of input voltages that the comparators can operate on is between the highest Vref and the ground, inclusive. The high-common input range of the comparators thus ensures reception of varying voltage levels from multiplexers.

Figure 2:
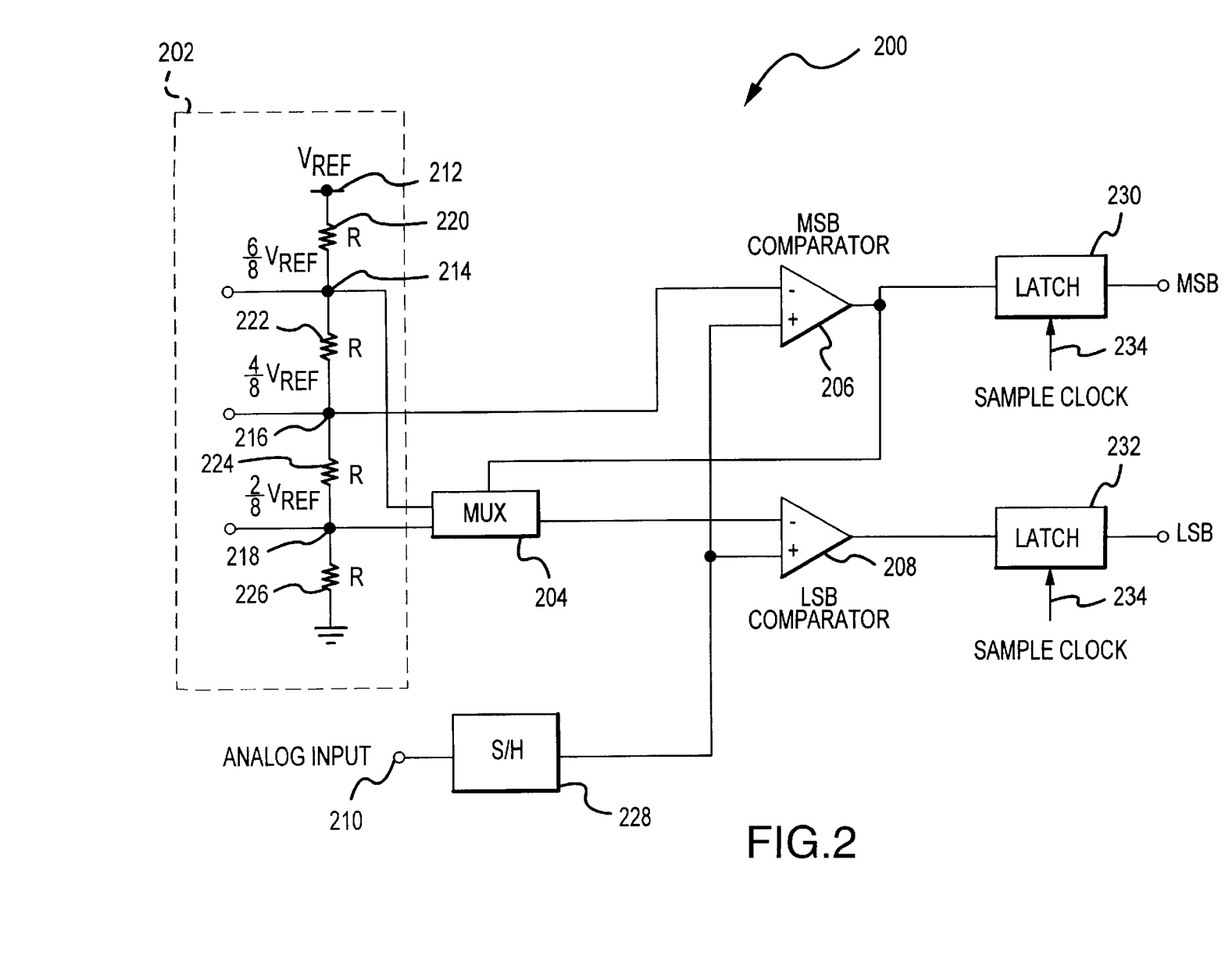
FIG. 2 illustrates a circuit diagram of a 2-bit pseudo-flash A/D converter in accordance with the present invention.

Since the complexity of a flash A/D converter increases rapidly with the increase in bits, the circuits of the present invention are described in the order of complexity, from 2-,3-, and 4-bit A/D converters to a generalized n-bit A/D converters. FIG. 2 illustrates a circuit diagram of a 2-bit pseudoflash A/D converter 200 in accordance with the present invention. The 2-bit auto-reference pseudo-flash A/D converter 200 consists of a resistor network 202, a multiplexer 204, and two comparators 206 and 208. The resistor network 202 (e.g., potentiometric resistor string, ladder network, etc.) includes $2^n$ or four resistors 220, 222, 224, and 226 of preferably identical resistance R coupled in series between a voltage potential defined by a reference voltage, Vref 212, and a ground 213. When the voltage potential is applied, a series of reference voltages of differing magnitudes are generated at the junctions connecting one resistor to another resistor thereby forming nodes 214, 216, and 218. For example, reference voltages 6Vref/8, 4Vref/8, and 2Vref/8, respectively, are generated at the nodes 214, 216, and 218, respectively. The three reference voltages at nodes 214, 216, and 218 represent $2^n-1$ or three discrete quantization levels for the 2-bit A/D converter. Although such a resistor network is employed in the present invention, other circuits that can generate these reference voltage levels are equally suitable for implementation in the present invention. For example, conventional diode connected transistors can be used in place of resistors to generate reference voltages between two fixed voltages.

The 2-bit A/D converter of FIG. 2 requires two (i.e., n=2) comparators: a MSB (most-significant-bit) comparator 206 and a LSB (least-significant-bit) comparator 208. At the positive input terminals, both MSB and LSB comparators 205 and 208 receive an analog input signal, $V_A$, which is to be converted into a digital code. The reference input of the MSB comparator 206 is coupled at the negative input terminal to Vref/2 or 4Vref/8, which corresponds to the reference voltage at node 216. Those skilled in the art will recognize that with minor modifications, the coupling scheme may be reversed with the analog input signal being coupled to the negative input terminals and the reference voltages being coupled to the positive input terminals.

The MSB comparator 206 compares the analog input signal, $V_A$, with its reference input voltage, Vref/2. If the reference input voltage, Vref/2, is smaller than the analog input signal, $V_A$, then the MSB comparator generates an output state equivalent to 1. On the other hand, if the reference input voltage is larger than the analog input signal, then the output of the MSB comparator will be at the 0 state.

In the converter circuit of FIG. 2, the output of the MSB comparator 206 represents the most significant bit in the converted code. In addition, the output of the MSB comparator 206 is used to control the multiplexer 204. The multiplexer receives two reference voltages: 3Vref/4 (i.e., 6Vref/8) or Vref/4 (i.e., 2Vref/8). The output of the MSB comparator 206 selects one of the inputs the multiplexer, which will be a reference voltage of the LSB comparator 208. Specifically, when the output of the MSB comparator 206 is 1, the higher reference voltage is selected, which is 3Vref/4. Conversely, when the output is 0, the lower reference voltage, namely Vref/4, is selected by the multiplexer. In this manner, the multiplexer "automatically" selects a reference voltage for input to a comparator. In the present 2-bit A/D converter configuration, one multiplexer replaces a comparator in the present 2-bit auto-reference pseudo-flash A/D converter. Since multiplexers are typically simpler, cheaper, and consume less power than comparators, the present invention provides savings in cost, space, and power consumption over the traditional flash converters. Furthermore, by using the multiplexer, the 2-bit auto-reference pseudo-flash A/D converter circuit does away with an encoding logic to encode the output of the comparators into a 2-bit parallel word.

The selected reference voltage is then transmitted to the reference input terminal of the LSB comparator 208, which is coupled to the multiplexer 204. Similar to the MSB comparator 206, the LSB comparator 208 compares the reference voltage to the analog input voltage, $V_A$. If the reference input voltage is smaller than the analog input signal, $V_A$, then the MSB comparator generates an output state equivalent to 1. On the other hand, if the reference input voltage is larger than the analog input signal, then the output of the MSB comparator will be at the 0 state.

With reference to FIG. 2, the auto-reference pseudo-flash A/D converter may include a sample-and-hold circuit 228 for receiving an analog input signal, $V_A$, and then holding the signal for input into the comparators 206 and 208 to avoid changing the signal during the conversion process. The sample-and-hold circuit 228 samples analog input and holds the sampled input until the MSB comparator 206 and LSB comparator 208 can function synchronously. In addition, the A/D converter may include a latch for each of the comparators 206 and 208 to latch the output of the comparators 206 and 208. A sample clock can also be provided enable the latches to operate at the same sample clock and also to latch the output of the latches 230 and 232 as the output in digital format.

Figure 3:
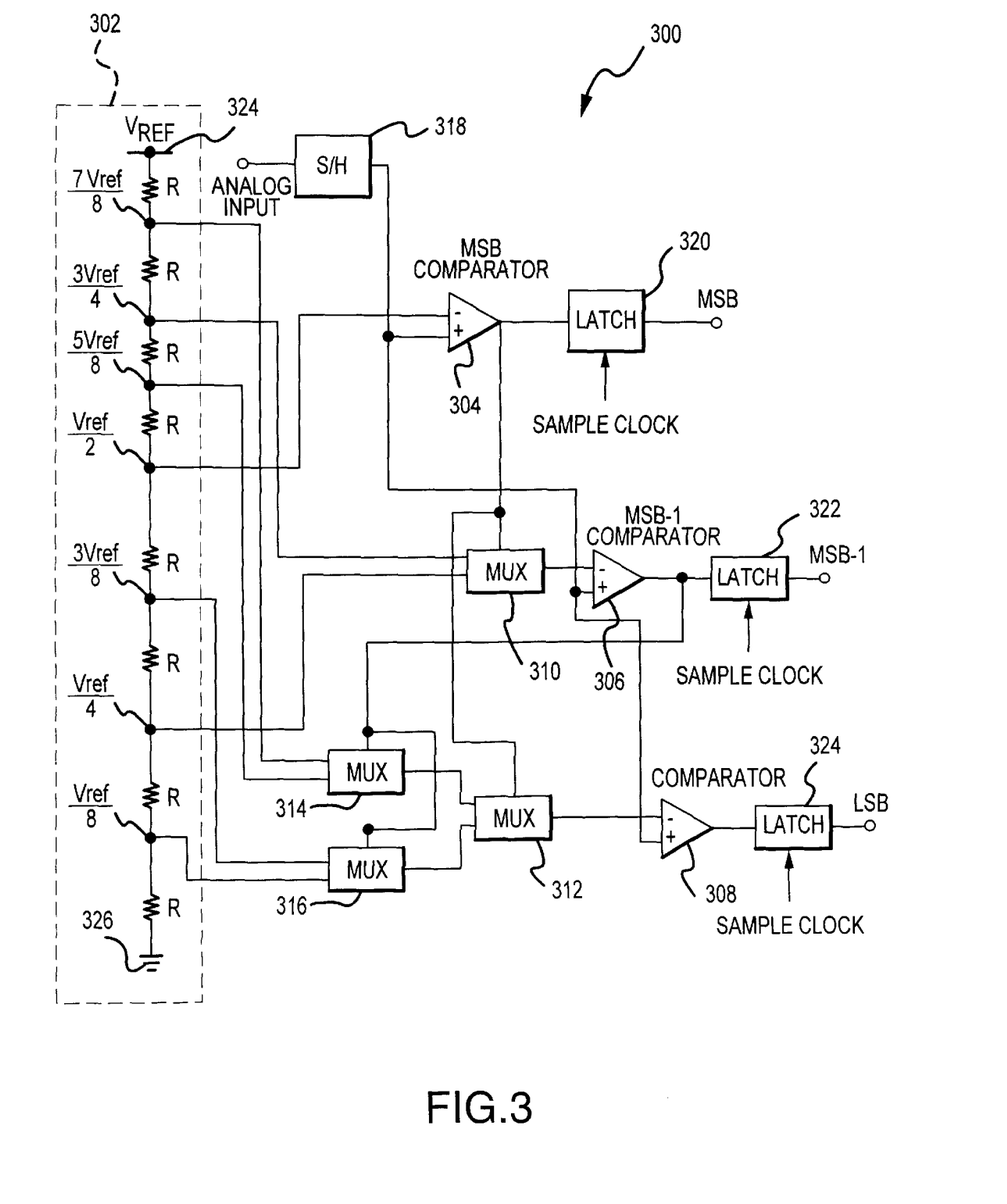
FIG. 3 illustrates a circuit diagram of a 3-bit pseudo-flash A/D converter according to the present invention.

The 2-bit auto-reference pseudo-flash A/D converter 200 can be modified with additional components to generate an A/D converter with a higher resolution word. For example, FIG. 3 illustrates a circuit diagram of a 3-bit auto-reference pseudo-flash A/D converter 300 according to the present invention. The 3-bit pseudo-flash A/D converter 300 includes a resistor network 302 including 8 resistor components, three comparators 304, 306, and 308, and four multiplexers 310, 312, 314, and 316. Hence, the 3-bit A/D converter 300 adds four more resistor components, three more multiplexers, and a comparator to the basic 2-bit A/D converter 200 to account for the addition circuitry for generating the third extra bit.

In contrast to three reference voltage levels required in the 2-bit A/D converter 200, the 3-bit A/D converter 300 requires $2^n-1$ (i.e., $2^3-1$) or 7 reference voltage levels for quantizing an analog input into a 3-bit word. To provide these levels, the resistor network 302 includes $2^n$ or 8 (i.e., n=3) resistors coupled in series between a reference voltage, Vref 324, and a ground 326. The resistor network 302 thus generates 7 reference voltage levels at the nodes between resistors for quantizing an analog input: 7Vref/8, 3Vref/4, 5Vref/8, Vref/2, 3Vref/8, Vref/4, and Vref/8.

Of these reference voltages, the reference voltage of Vref/2 is supplied to an MSB comparator 304 and the remaining reference voltages are provided to multiplexers 310, 314, and 316. Specifically, the reference voltages, 3Vref/4 and Vref/4, are supplied as inputs to the multiplexer 310. The reference voltages, 7Vref/8 and 5Vref/8, are provided to the inputs of the multiplexer 314. The remaining two reference voltages, 3Vref/8 and Vref/8, are supplied to the multiplexer 316 as inputs.

The 3-bit A/D converter 300 includes three comparators 304, 310, and 312 to generate a 3-bit word. Each of these comparators receive an analog input signal in one of its input terminals. The other input terminal receives a reference voltage. The MSB comparator 304 generates the most significant bit at its output based on the analog input and Vref/2. The output of the MSB comparator 304 is also used as a control signal as in the 2-bit A/D converter 200. In this case, however, the output is supplied to a pair of multiplexers 310 and 312, which belong in the same hierarchy of multiplexers classified in accordance with the control signal provided. The multiplexer 310 receives reference voltages of 3Vref/4 and Vref/4. When the output of the MSB comparator 304 is 1, the multiplexer 310 selects the higher reference voltage, 3Vref/4. Conversely, if the MSB comparator 304 output is 0, the multiplexer 310 selects the lower reference voltage, Vref/4. The selected reference voltage and the analog input are then supplied to the MSB-1 comparator 306 as inputs. Based on these inputs, the MSB-1 comparator 306 generates an output, MSB-1 bit, which represents the second most significant bit in the 3-bit digital word.

The output of the MSB-1 comparator 306 is also used as a control signal for the multiplexers 314 and 316 to select a reference voltage. Specifically, in response to the control signal, the multiplexer 314 selects a reference voltage from two input references voltages: 7Vref/8 and 5Vref/8. Similarly, the multiplexer 316 selects a reference voltage from its inputs: 3Vref/8 and Vref/8. By receiving the same control signal, the multiplexers 314 and 316 define another hierarchy of multiplexers distinct and apart from the hierarchy defined by the multiplexers 310 and 312. As described above, a higher reference voltage is selected when the control signal is equivalent to 1; a lower reference voltage is selected when the control signal is equivalent to 0. Those skilled in the art will no doubt appreciate that the selection scheme can easily be reversed to work in the present invention so that a higher reference voltage is selected when the control signal is equivalent to 0 and vice versa.

The selected reference voltages from the multiplexers 314 and 316 are then transmitted to the multiplexer 312 as inputs. The multiplexer 312, in turn, selects a reference voltage from its input reference voltages in response to the control signal, which is the output of the MSB comparator 304. The selected reference voltage is then transmitted to the LSB comparator 308. The LSB comparator 308 receives the selected reference voltage from the multiplexer 312 and the analog input in its input terminals. The LSB comparator 308 then generates an output, which represents the least significant bit in the 3-bit digital word. As in the 2-bit A/D converter 200, the outputs of the comparators 304, 306, and 308, respectively, can be coupled to latches 320, 322, and 324, respectively, to latch the outputs. Additionally, a sample clock can be provided to enable the latches to operate at the same sample clock. Also, a sample-and-hold circuit 318 can be provided for receiving an analog input signal, $V_A$, and then holding the signal for input into the comparators 304, 306, and 308 to avoid changing the signal during the conversion process.

Figure 4:
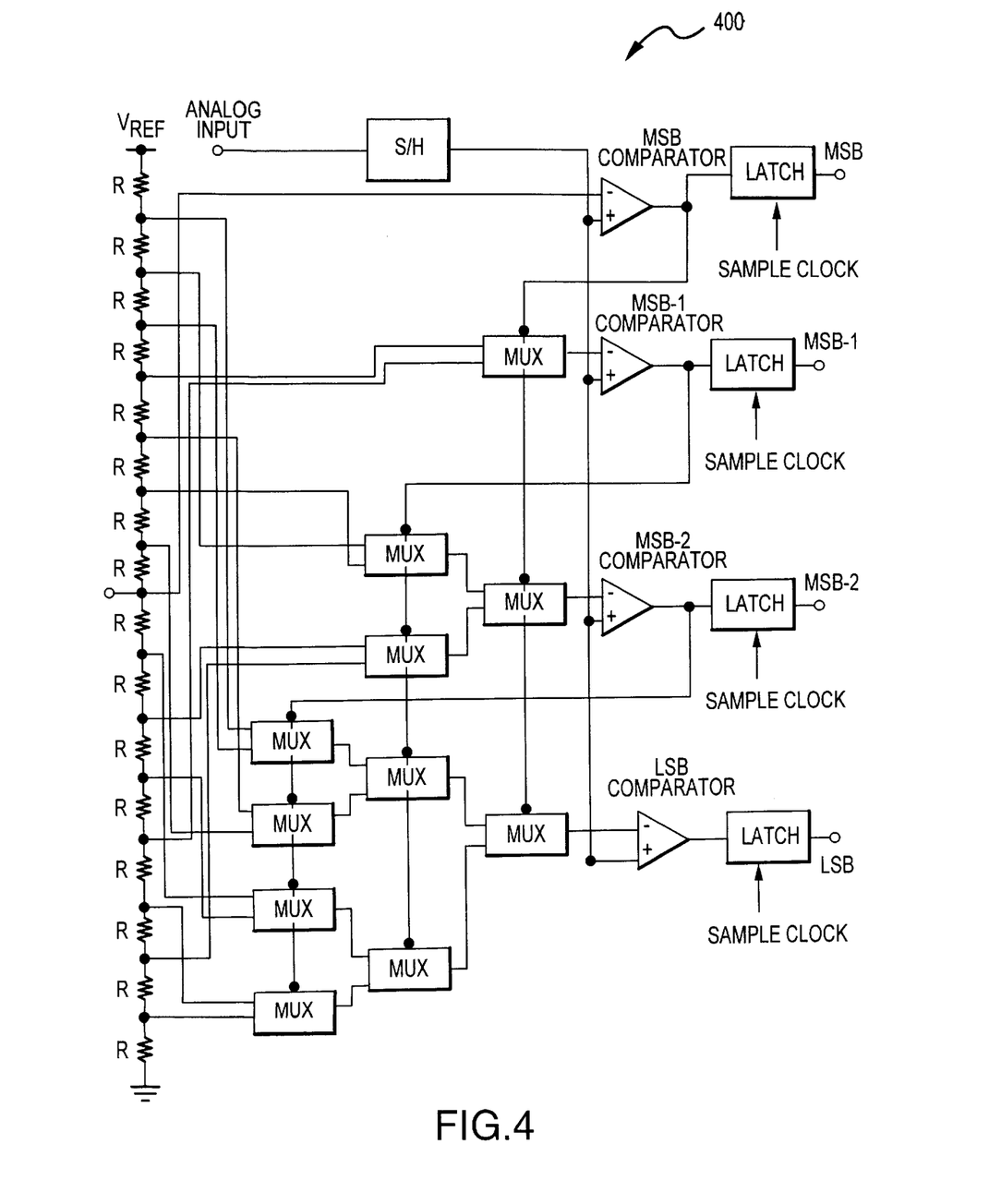
FIG. 4 illustrates a circuit diagram of a 4-bit pseudo-flash A/D converter in accordance with the present invention.

As illustrated in FIG. 2 and 3, the A/D converters of the present invention can easily be modified with additional components to provide a higher resolution of bits in a digital code word. For example, FIG. 4 illustrates a circuit diagram of a 4-bit pseudo-flash A/D converter 400 in accordance with the present invention. The 4-bit A/D converter 400 merely adds 8 more resistor components, 7 more multiplexers, and a comparator to the 3-bit A/D converter 300.

Figure 5:
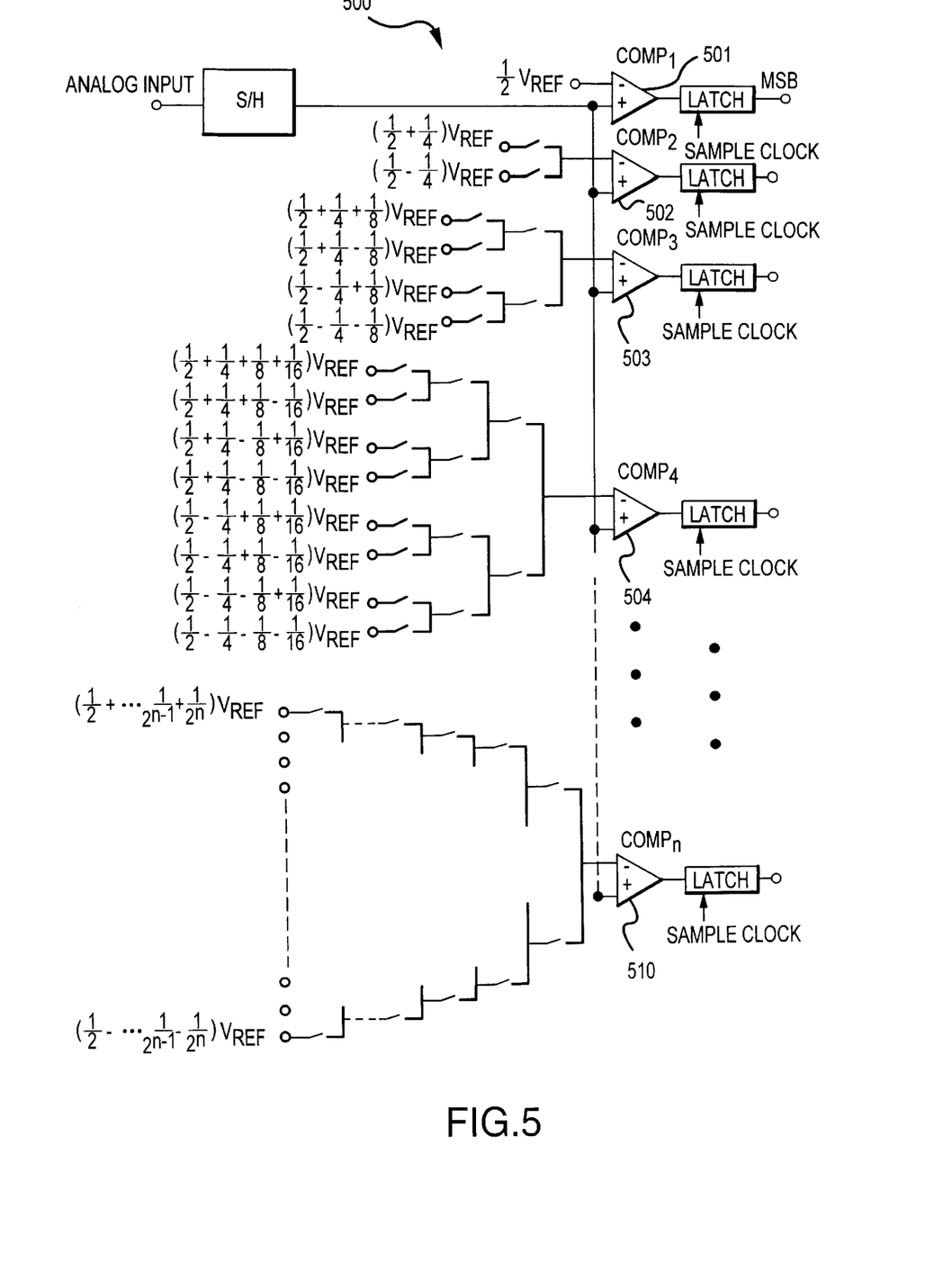
FIG. 5 illustrates a simplified circuit diagram of an n-bit auto-reference pseudo-flash A/D converter using multiplexers.

A simplified generic n-bit pseudo-flash A/D converter 500 using multiplexers in accordance with the present invention is illustrated in FIG. 5. The generic n-bit A/D converter 500 first includes $2^n$ resistor components (not shown) for generating $2^n-1$ reference voltages between two fixed reference voltages, Vref and ground. The $2^n-1$ reference voltages are described by $iVref/2^n$, where i is an integer ranging between 1 and $2^n-1$, inclusive. The n-bit A/D converter also includes n comparators for generating n-bit word. Each of these n comparators receives an analog input and a reference voltage for comparing the analog input. Preferably, the analog input is transmitted to the comparators through a sample-and-hold circuit or amplifier.

With reference to FIG. 5, the middle or center reference voltage, Vref/2, is provided to the MSB comparator 501. The remaining $2^n-2$ reference voltages are capable of being supplied to the n comparators according to the following relationship: The reference voltages from $Vref*1/2+\Sigma 1/2^k$ (k=2 to n) $1/2-\Sigma 1/2^k$ (k=2 to n) are supplied to a comparator representing or associated with the nth bit. For example, for the second bit or comparator, the available reference voltages are 3Vref/4 and Vref/4. For third bit, the reference voltages available to the third comparator are 7Vref/8, 5Vref/8, 3Vref/8, and Vref/8.

The n-bit A/D converter 500 also includes a total of ($2^n-1-n$) multiplexers to select an appropriate reference voltage for the comparators. To provide an appropriate reference voltage for a comparator representing or associated with an nth bit (i.e., nth-bit comparator), ($2^{n-1}-1$) multiplexers are coupled between the resistor network and an nth-bit comparator. The multiplexers then select a reference voltage in response to the output signals of comparators associated with the more significant bits. The selected reference voltage is then transmitted to the nth-bit comparator, which compares the selected reference voltage with the analog input signal and generates digital output signal. The nth-bit output signal, in turn, can be used to control multiplexers associated with less significant bits in selecting a reference voltage.

In short, to generate an nth bit digital output, the ($2^{n-1}-1$) multiplexers select a reference voltage based on control signals provided by the outputs of comparators associated with more significant bits. For example with reference to FIGS. 3 and 4, the output of the most significant bit comparator is coupled to the multiplexers connected directly to each of the other comparators, thus defining a hierarchy of multiplexers. Also, the output of the second most significant bit comparator is coupled to the multiplexers next in line or hierarchy. The output of a comparator is thus used to control the multiplexers associated with less significant bits of same hierarchy. The output of each of the comparators can be coupled to a latch to latch the output. Additionally, a sample clock can be provided to enable the latches to operate at the same sample clock.

The pseudo-flash A/D converter of the present invention can also be implemented using decoders instead of multiplexers. The use of the decoders is particularly beneficial when a series of multiplexers are required. For instance, when several multiplexers are connected in series, the turn-on voltages of the switches in the series connected multiplexers typically generate an error. Conventional high precision circuits generally used an additional circuit to perform an offset cancellation of the error. In one embodiment, the present invention utilizes decoders to replace multiplexers to reduce the error.

Figure 6:
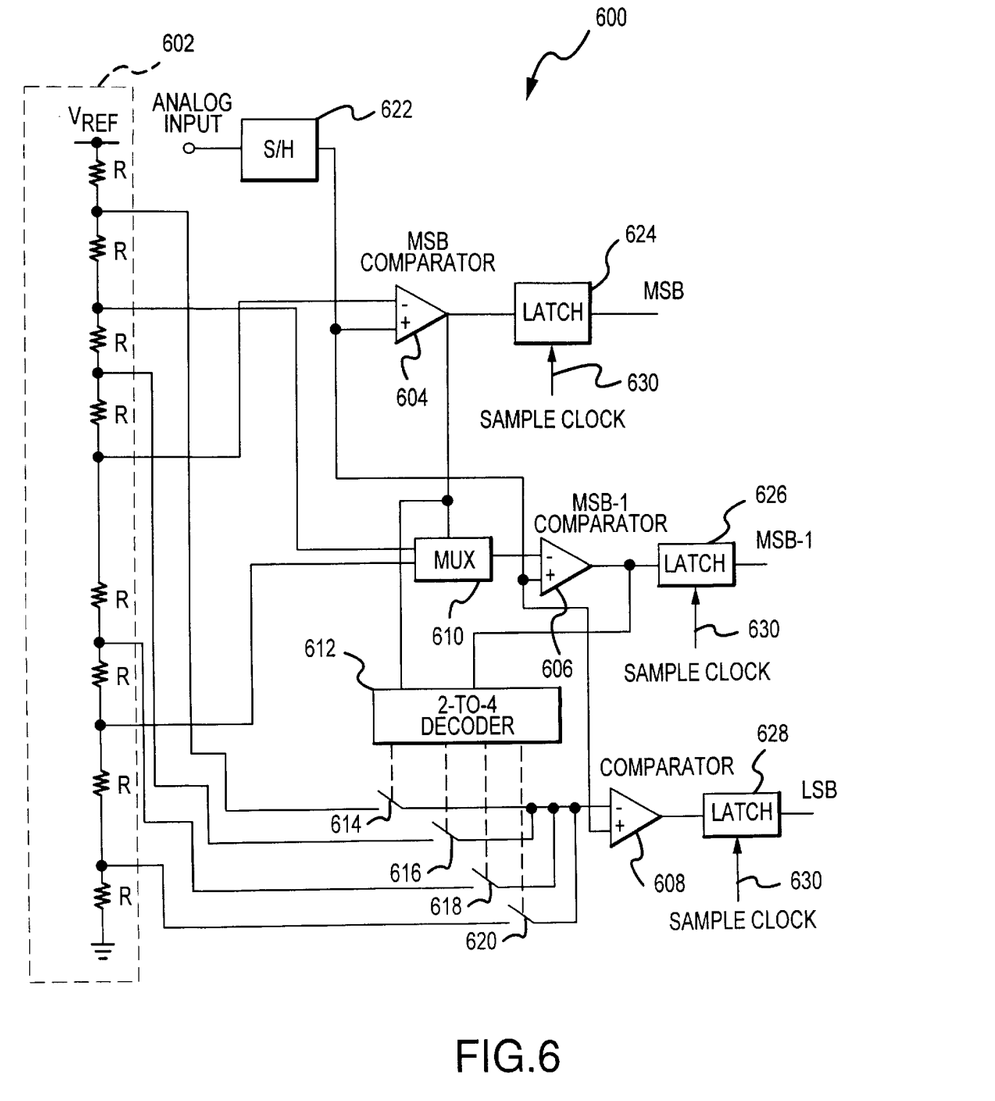
FIG. 6 illustrates a circuit diagram of a 3-bit pseudo-flash A/D converter including a multiplexer and a decoder according to the present invention.

In accordance with an embodiment of the present invention, FIG. 6 illustrates a circuit diagram of a 3-bit pseudo-flash A/D converter 600 including a multiplexer 610 and a decoder 612. The 3-bit A/D converter 600 is identical to the 3-bit A/D converter illustrated in FIG. 3 except for the decoder 612 and a plurality of switches 614, 616, 618, and 620. Specifically, in place of three multiplexers 312, 314, and 316 used in the 3-bit pseudo-flash A/D converter 300, the present 3-bit A/D converter 600 uses a 2-to-4 decoder 612 coupled to the four switches 614, 616, 618, and 620 for selecting a reference voltage for the LSB comparator 608. The four switches 614, 616, 618, and 620 are coupled to four reference voltages associated with the least significant bit level.

The 2-to-4 decoder 612 is controlled by two control signals provided by the outputs of the MSB comparator 604 and the MSB-1 comparator 606. These two control signals enable the decoder 612 to select one reference voltage from four reference voltages by turning on a switch corresponding to the selected reference voltage in the same way as the multiplexers 312, 314, and 316 selected a reference voltage from four reference voltages. The selected reference voltage is provided to the negative terminal of the LSB comparator 608 for comparison to an analog input, which can be supplied through a sample-and hold circuit or amplifier 622. The LSB comparator 608 then generates the least-significant-bit at its output. The outputs of the comparators 604, 606, and 608 can be coupled to latches 624, 626, and 628 to latch the outputs. A sample clock 630 can also be provided to enable the latches to operate in a synchronous manner.

Figure 7:
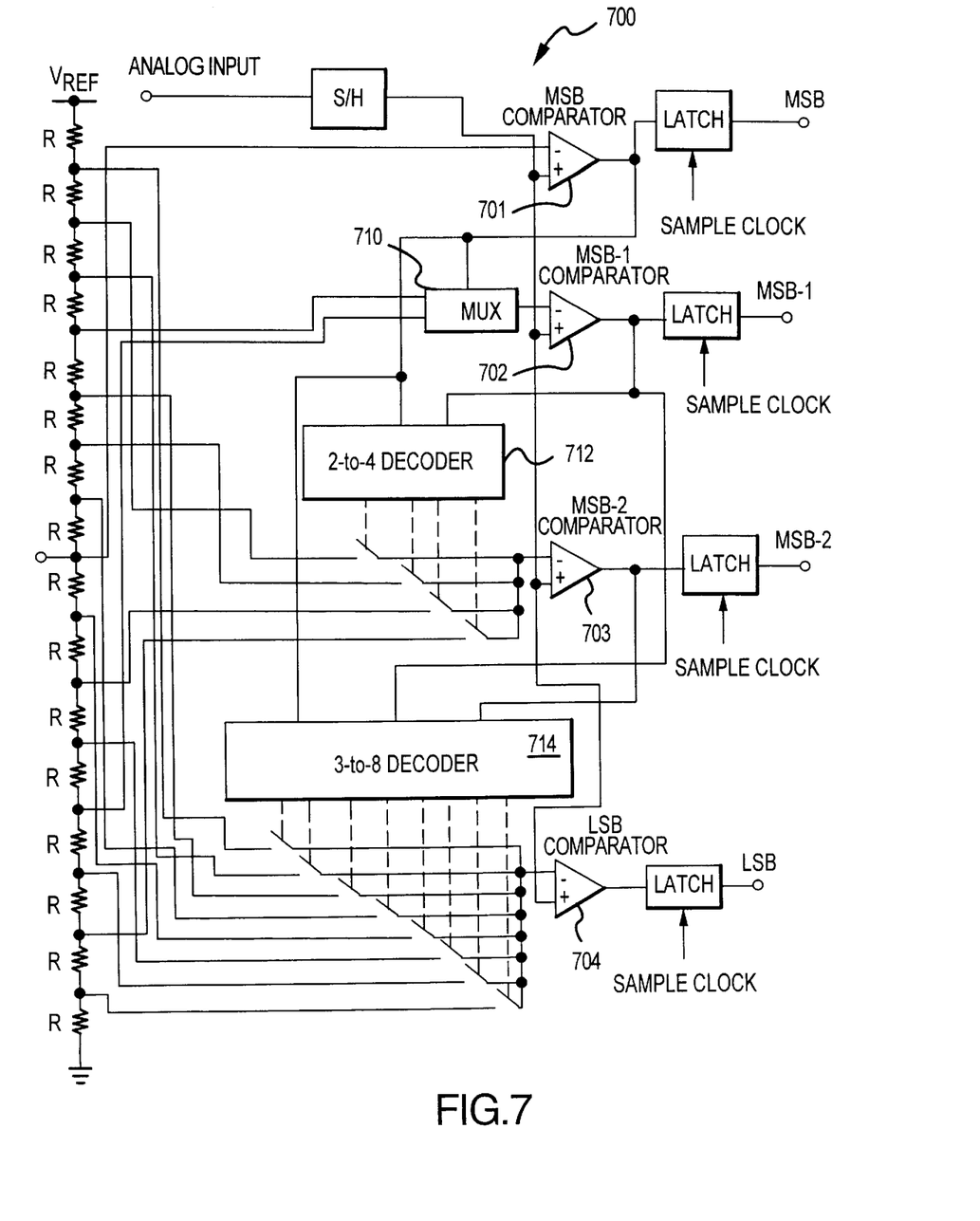
FIG. 7 illustrates a circuit diagram of a 4-bit pseudo-flash A/D converter including a multiplexer and two decoders in accordance with the present invention.

An A/D converter with a higher resolution word can be constructed from the basic 3-bit pseudo-flash A/D converter 600 with additional components. For example, FIG. 7 illustrates a circuit diagram of a 4-bit pseudo-flash A/D converter 700 including a multiplexer 710 and two decoders 712 and 714 in accordance with the present invention. The 4-bit A/D converter 700 adds 8 more resistor components, an additional decoder 714 with switches, and a comparator 704 to the 3-bit A/D converter 300. These additional circuitry are needed to generate the extra fourth bit from the LSB comparator 704.

The additional decoder 714 is a 3-to-8 decoder for selecting a reference voltage from 8 reference voltages. The 3-to-8 decoder 714 is coupled to eight switches for selecting a reference voltage for an LSB comparator. The eight switches are coupled to the eight reference voltages associated with the least significant bit level. The outputs of the first three comparators 701, 702, and 703 are used to control the 3-to-8 decoder 714 in selecting a reference voltage.

These three control signals enable the 3-to-8 decoder 714 to select one reference voltage from four reference voltages by turning on the switch corresponding to the selected reference voltage. The selected reference voltage is provided to the negative terminal of the LSB comparator 704 for comparison to an analog input, which can be supplied through a sample-and hold circuit or amplifier. The LSB comparator 704 then generates the least-significant-bit at its output. The output of each of the comparators can be coupled to a latch to latch the output. A sample clock can also be provided to enable the latches to operate at the same sample clock.

Figure 8:
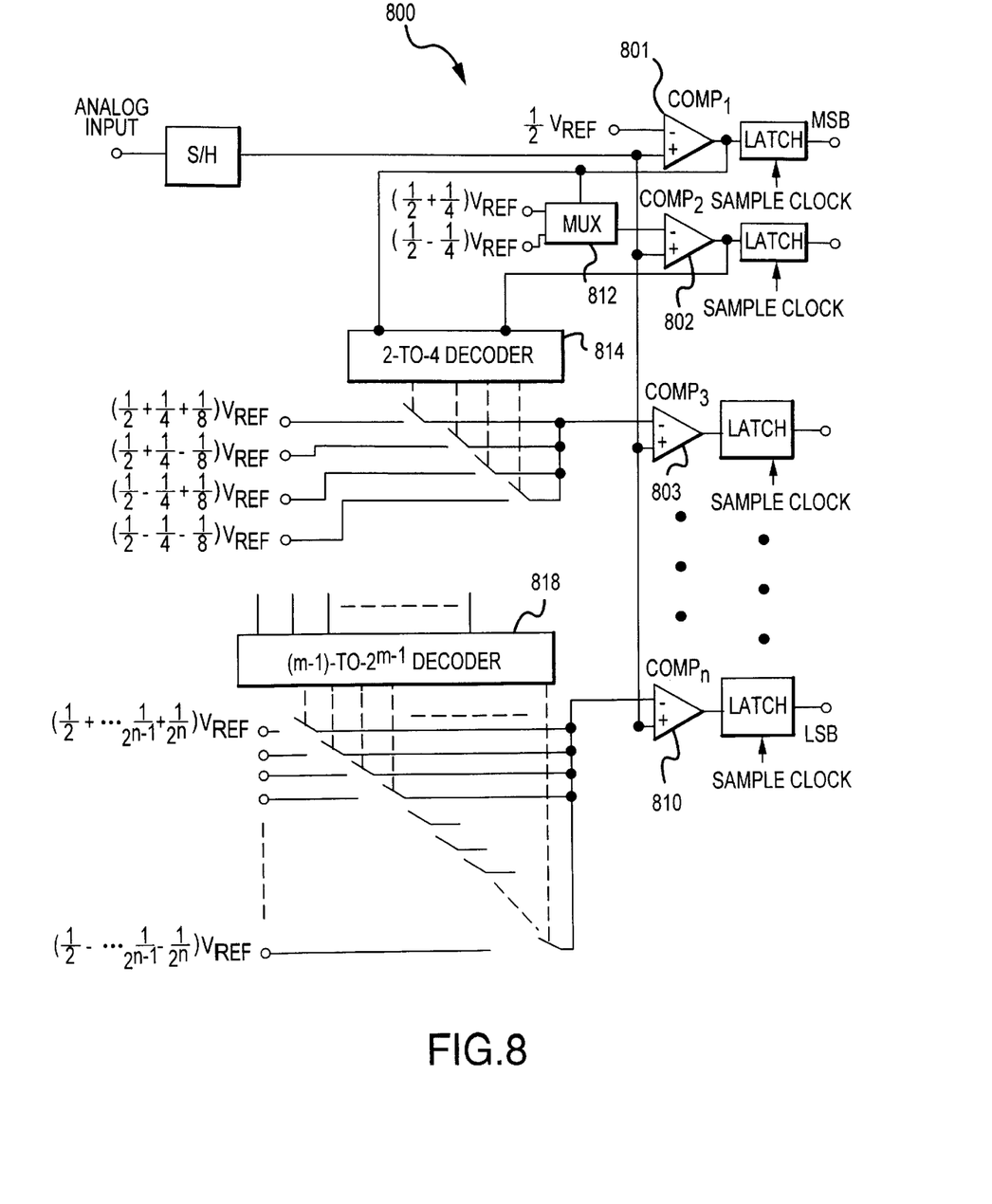
FIG. 8 illustrates a simplified circuit diagram of an n-bit auto-reference pseudo-flash A/D converter using a multiplexer and decoders.

A simplified generic n-bit pseudo-flash A/D converter 800 using a multiplexer and decoders in accordance with the present invention is illustrated in FIG. 8. The generic n-bit A/D converter 800 includes $2^n$ resistor components (not shown), a multiplexer, n comparators, and (n-2) decoders. The $2^n$ resistor components generate ($2^n-1$) reference voltages between two fixed reference voltages, Vref and ground. The ($2^n-1$) reference voltages are described by $iVref/2^n$, where i is an integer ranging between 1 and $2^n-1$. The n-bit A/D converter also includes n comparators for generating an n-bit word. Each of these n comparators receives an analog input and a reference voltage for comparing the analog input. Preferably, the analog input is transmitted to the comparators through a sample-and-hold circuit or amplifier.

With reference to FIG. 8, the middle or center reference voltage, Vref/2, is provided to the MSB comparator 801, the most-significant-bit comparator. The remaining $2^n-2$ reference voltages are capable of being supplied to the n comparators according to the following relationship: The reference voltages from $Vref*1/2+\Sigma 1/2^k$ (k=2 to n) $1/2-\Sigma 1/2^k$ (k=2 to n) are supplied to a comparator representing nth bit. For example, for the second bit or comparator, the available reference voltages are 3Vref/4 and Vref/4. For third bit, the reference voltages available to the third comparator are 7Vref/8, 5Vref/8, 3Vref/8, and Vref/8.

The n-bit A/D converter 800 also includes a multiplexer 812 to select an appropriate reference voltage for the second-most-significant-bit comparator 802. The multiplexer select a reference voltage based on a control signal provided by an output of the most-significant-bit comparator. For example with reference to FIGS. 6 and 7, the output of the most-significant-bit comparator is coupled to the multiplexer connected directly to the second-most-significant-bit comparator. In addition, the outputs of the first and second most significant bit comparators 801 and 802 are coupled to the 2-to-4 decoder 814 for selecting a reference voltage for the third-most-significant-bit comparator 803. In short, the outputs of comparators are used to control the decoders associated with less significant bits in selecting a reference voltage.

The n-bit A/D converter 800 provides a decoder for every comparator except for the first two most-significant-bit comparators. In general, an mth bit comparator receives a reference voltage from a corresponding $(m-1)$-to-$(2^{m-1})$ decoder. In other words, for an mth bit comparator, the $(m-1)$-to-$(2^{m-1})$ decoder selects one reference voltage among $(2^{m-1})$ reference voltages in response to $(m-1)$ control signals provided by the outputs of the more significant-bit comparators. In turn, the $(m-1)$-to-$(2^{m-1})$ decoder is coupled to $(m-1)$ switches for selecting a reference voltage for an LSB comparator. These $(m-1)$ switches are coupled to the $(m-1)$ reference voltages associated with the mth bit. The output of each of the comparators can be coupled to a latch to latch the output. Additionally, a sample clock can be provided to enable the latches to operate at the same sample clock.

The present invention provides a pseudo-flash A/D converter that can be efficiently implemented with only n comparators as opposed to $(2^n-1)$ comparators required in conventional flash A/C converter. The use of multiplexers and/or decoders in lieu of comparators saves cost, space, and power consumption. Although the pseudo-flash A/D converters of the present invention yields the greatest benefit when implemented in an IC environment, they can also be implemented as monolithic circuits or discrete circuits. In the monolithic or discrete circuit settings, relay switches can replace a series of multiplexers for better performance. In addition, those skilled in the art will appreciate that the pseudo-flash A/D converter of the present invention can be implemented in a fully differential mode.

The present invention, an n-bit auto-reference pseudo-flash A/D converter, utilizes multiplexers and decoders instead of comparators to reduce the cost and complexity of an A/D converter. While the present invention has been described in particular embodiments, it should be appreciated that the present invention should not be construed as being limited by such embodiments, but rather construed according to the claims below.

What is claimed is:

1. An analog-to-digital converter circuit for converting an analog signal into an n-bit digital signal, comprising:

a resistor network for generating a plurality of reference voltages with uniform voltage increments between two fixed voltages;

n comparators coupled to receive a reference voltage from the resistor network, each comparator receiving a reference voltage and an analog input signal wherein an ith comparator generates an ith bit output in the n-bit digital signal where i ranges from 1 to n with the first bit of the n-bit digital signal being the most-significant-bit and the nth bit of the n-bit digital signal being the least-significant-bit; and $(2^{i-1}-1)$ multiplexers coupled between the resistor network and the ith comparator for selecting and transmitting a reference voltage to the ith comparator, in response to the output of comparators associated with the more significant bits, wherein the ith comparator compares the selected reference voltage with the analog input signal and generates the ith bit digital output.

2. The circuit as recited in claim 1 wherein the reference voltage supplied to the first bit comparator is half of the voltage difference between the two fixed voltages.

3. The circuit as recited in claim 1 further comprising a sample-and-hold circuit coupled to each of the n comparators, for sampling and holding the analog signal for input to each of the n comparators.

4. The circuit as recited in claim 1 further comprising n latches coupled to the output of the n comparators, one latch for each comparator wherein the latches latch the output of the comparators to provide a stable output for sampling.

5. The circuit as recited in claim 4 wherein the outputs of the latches are sampled synchronously in response to a sample clock input to the latches.

6. The circuit as recited in claim 1 wherein the resistor network generates $2^n-1$ reference voltages.

7. The circuit as recited in claim 6 wherein the resistor network includes $2^n$ resistor components.

8. The circuit as recited in claim 7 wherein the $2^n$ resistor components are coupled in series between the two fixed voltages.

9. The circuit as recited in claim 8 wherein each of the $2^n-1$ reference voltages are generated at a node defined by the junctions between the serially coupled resistor components.

10. The circuit as recited in claim 5 wherein the resistor components are resistors.

11. The circuit as recited in claim 5 wherein the resistor components are diode coupled transistors.

12. The circuit as recited in claim 1 wherein the comparators are operational amplifiers.

13. The circuit as recited in claim 1 wherein the comparators have a high-common input range.

14. An analog-to-digital converter circuit for converting an analog signal into an n-bit digital signal, comprising:

a resistor network for generating a plurality of reference voltages with uniform voltage increments between two fixed voltages;

n comparators coupled to receive a reference voltage from the resistor network, each comparator receiving a reference voltage and an analog input signal wherein an ith comparator generates an ith bit output in the n-bit digital signal where i ranges from 1 to n with the first bit of the n-bit digital signal being the most-significant-bit and the nth bit of the n-bit digital signal being the least-significant-bit; and a circuitry coupled between the resistor network and the ith comparator for selecting and transmitting a reference voltage to the ith comparator, in response to the output generated from the comparators associated with the more significant bits, wherein the ith comparator compares the selected reference voltage with the analog input signal and generates the ith bit digital output.

15. The circuit as recited in claim 14 wherein the reference voltage supplied to the first bit comparator is half of the voltage difference between the two fixed voltages.

16. The circuit as recited in claim 15 wherein the selecting and transmitting circuitry for the second bit comparator is a multiplexer.

17. The circuit as recited in claim 14 wherein the selecting and transmitting circuitry is a decoder and a plurality of switches coupled to the decoder.

18. The circuit as recited in claim 14 wherein the selecting and transmitting circuitry for comparators other than the first and second bit comparators is (n−2) decoders, one decoder for each comparator, wherein ith decoder selects a reference voltage from ($2^i-1$) reference voltages in response to (i−1) outputs generated from comparators with associated with less than ith bit.

19. The circuit as recited in claim 18 further including ($2^i-1$) switches coupled to the ($2^i-1$) reference voltages for switching the selected reference voltage onto the ith comparator.

20. The circuit as recited in claim 14 further comprising a sample-and-hold circuit coupled to each of the n comparators, for sampling and holding the analog signal for input to each of the n comparators.

21. The circuit as recited in claim 14 further comprising n latches coupled to the output of the n comparators, one latch for each comparator wherein the latches latch the output of the comparators to provide a stable output for sampling.

22. The circuit as recited in claim 21 wherein the outputs of the latches are sampled synchronously in response to a sample clock input to the latches.

23. The circuit as recited in claim 14 wherein the resistor network generates $2^n-1$ reference voltages.

24. The circuit as recited in claim 23 wherein the resistor network includes $2^n$ resistor components.

25. The circuit as recited in claim 24 wherein the $2^n$ resistor components are coupled in series between the two fixed voltages.

26. The circuit as recited in claim 25 wherein each of the $2^n-1$ reference voltages are generated at a node defined by the junctions between the serially coupled resistor components.

27. The circuit as recited in claim 24 wherein the resistor components are resistors.

28. The circuit as recited in claim 24 wherein the resistor components are diode coupled transistors.

29. The circuit as recited in claim 14 wherein the comparators are operational amplifiers.

30. The circuit as recited in claim 14 wherein the comparators have a high-common input range.

* * * * *